US007760124B2

(12) United States Patent
Trescases

(10) Patent No.: US 7,760,124 B2
(45) Date of Patent: Jul. 20, 2010

(54) SYSTEM AND METHOD FOR A/D CONVERSION

(75) Inventor: Olivier Trescases, Villach (AT)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 12/326,421

(22) Filed: Dec. 2, 2008

(65) Prior Publication Data

US 2010/0134083 A1     Jun. 3, 2010

(51) Int. Cl.
*H03M 1/12* (2006.01)
(52) U.S. Cl. .................... 341/155; 327/295
(58) Field of Classification Search ......... 341/140–155; 327/295, 513
See application file for complete search history.

(56) References Cited

U.S. PATENT DOCUMENTS

| 4,129,832 | A | * | 12/1978 | Neal et al. ............... 331/44 |
| 4,242,637 | A | * | 12/1980 | Ferguson ................ 327/27 |
| 6,005,377 | A | | 12/1999 | Chen et al. |
| 6,885,176 | B2 | * | 4/2005 | Librizzi ................ 323/285 |
| 6,958,721 | B2 | | 10/2005 | Vincent et al. |
| 2006/0055574 | A1 | | 3/2006 | Maksimovic et al. |

OTHER PUBLICATIONS

Hu, H., et al., "Nonlinear Control for Improved Dynamic Response of Digitally Controlled DC-DC Converters", 37th IEEE Power Electronics Specialists Conference, Jun. 18-22, 2006, pp. 2584-2590, Jeju, Korea.

* cited by examiner

*Primary Examiner*—Lam T Mai
(74) *Attorney, Agent, or Firm*—Slater & Matsil, L.L.P.

(57) ABSTRACT

In one embodiment, a method of performing an A/D conversion includes comparing a reference signal to a ramp signal, comparing an input signal to the ramp signal and causing a signal to propagate through a delay line when the ramp signal crosses a first of the reference signal or the input signal. The state of the delay line is stored when the ramp signal crosses a second of the reference signal or the input signal after the ramp signal crosses the first of the reference signal or the input signal.

39 Claims, 11 Drawing Sheets

US 7,760,124 B2

SYSTEM AND METHOD FOR A/D CONVERSION

TECHNICAL FIELD

The invention relates generally to Analog to Digital (A/D) conversion, and more particularly to a delay line based A/D that converts a differential input voltage to the digital domain.

BACKGROUND

The control of switch-mode power supplies (SMPS) is increasingly moving to the digital domain. Digital control of power supplies allows for increased flexibility and robustness. For example, a digitally controlled and compensated power supply can be easily adapted for use in multiple electrical environments by reprogramming a digital compensation algorithm instead of changing or redesigning analog compensation networks. The use of such digital control and compensation can also save manufacturing costs and allow for sophisticated compensation schemes that may be difficult or impossible to implement in the analog domain.

In order to implement a digitally controlled power supply, an A/D converter is typically required. The inclusion of A/D converters in power supply systems, however can lead to higher material costs, integrated circuit area, test time and design effort. In power supply applications where multiple power supplies are being digitally regulated, multiple A/D converters may be used, or a single, high speed A/D with a multiplexed input can be used. Both of these solutions may lead to increased cost, silicon area, and power consumption.

A number of different A/D topologies have been proposed to for use in digitally controlled power supply systems. For example, a flash A/D can be used in a power supply system, but, the area and power consumption of a flash A/D may be prohibitive, especially in low-power power supply systems. A Successive Approximation A/D, on the other hand, may be more power efficient, but requires multiple clock cycles to perform each conversion, which makes it difficult to use with a multiplexed input at high per-channel sample rates.

What is needed are low-power, cost effective A/D converters that are well suited for use in power supply systems.

SUMMARY OF THE INVENTION

In one embodiment, a method of performing an A/D conversion includes comparing a reference signal to a ramp signal, comparing an input signal to the ramp signal and causing a signal to propagate through a delay line when the ramp signal crosses a first of the reference signal or the input signal. The state of the delay line is stored when the ramp signal crosses a second of the reference signal or the input signal after the ramp signal crosses the first of the reference signal or the input signal.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to illustrate clearly the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, A/D converters for a digitally controlled switched mode power supply system. The invention may also be applied, however, to other systems such as general power supply systems, control systems, and/or other systems that require A/D converters.

Figure 1:
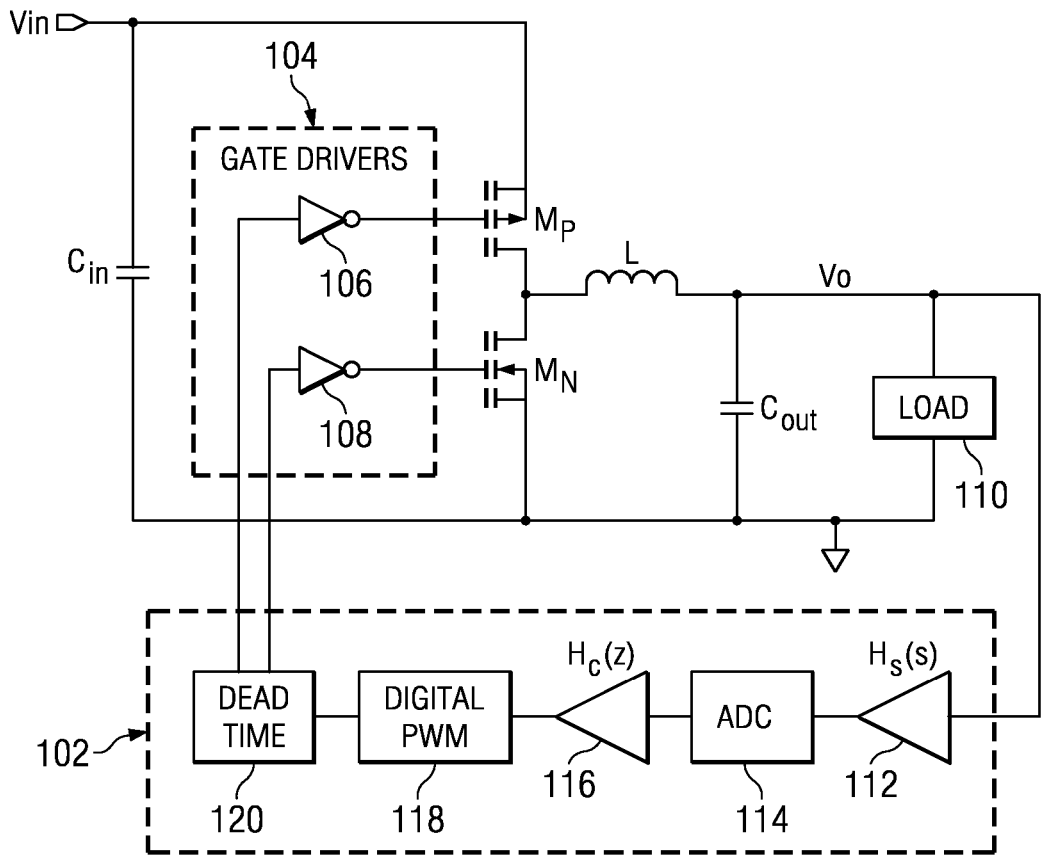
FIG. 1 illustrates a schematic of an embodiment power supply system.

FIG. 1 illustrates a simplified schematic of embodiment power supply system 100 that provides power to load 110. Power supply system 100 essentially converts an input voltage Vin loaded by capacitor Cin to output voltage $V_O$. Gate driver 104, represented by inverter 106 and buffer 108, control switching transistors $M_P$ and $M_N$ that drive an LC circuit made of inductor L and output capacitance Cout. In alternative embodiments of the present invention, power supply system 100 may also comprise other circuit components such as diodes and bipolar transistors. For example, in an alternative embodiment, high side switch $M_p$ can be implemented with an n-channel device such as a DMOS device. Furthermore, in other embodiments, other converter topologies, such as boost converters, buck converters, boost-buck converters, and flyback converters can be used.

Gate driver 104 is controlled by feedback network 102, which has analog compensation network 112, A/D converter 114, digital compensation network 116, digital pulse width modulator (PWM) 118, and dead time generation circuit 120. Analog compensation network 112 and digital compensation network 116, which dynamically compensates the power supply network to ensure stability, can be architected using conventional techniques known in the art. Alternative embodiments of the present invention may omit analog compensation network 112 if digital compensation is sufficient to maintain adequate performance. Furthermore, in power supply system embodiments that are stable and perform well without compensation, both analog compensation network 112 and digital compensation network 116 may be omitted.

Digital PWM generator 118, which generates a pulse width modulated signal to drive gate drivers 104, can be architected using conventional techniques. Dead time generation circuit 120 adjusts the timing of input signals to gate driver 104 to ensure that transistors are not $M_P$ and $M_N$ simultaneously conducting appreciable current. In alternative embodiments of the present invention, the ordering, existence, and architecture of these power supply system blocks may vary according to the specific embodiment.

Figure 2B:
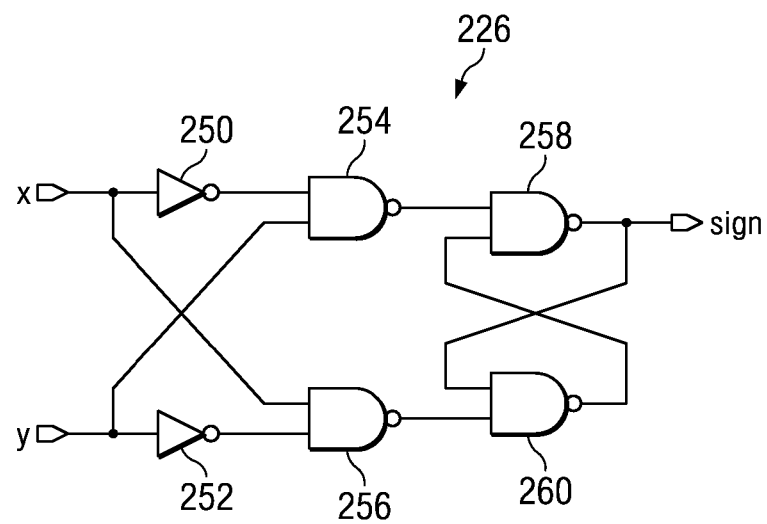
FIGS. 2a-2b illustrate schematics of an embodiment A/D converter.
Figure 2A:
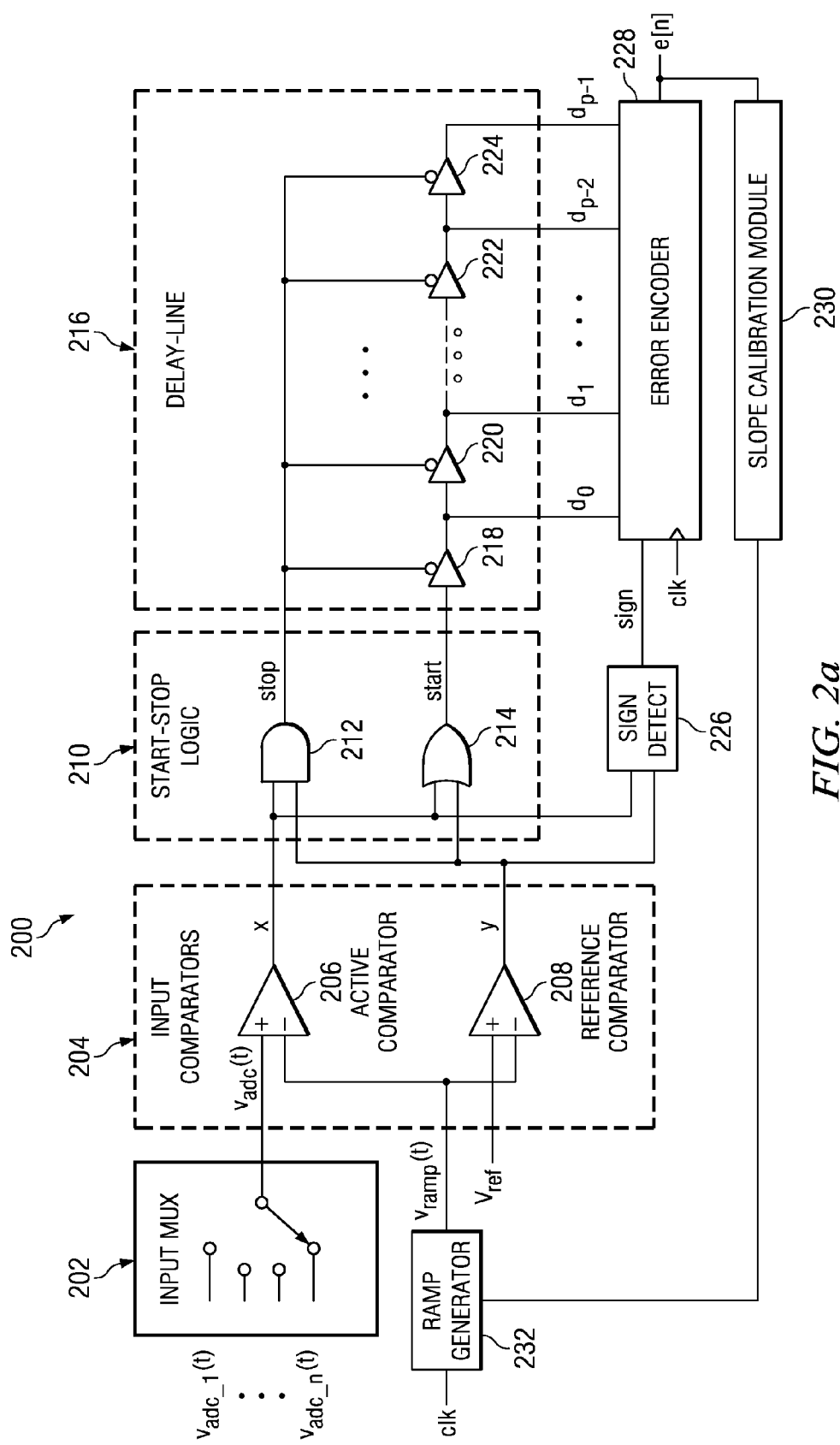

Turning to FIG. 2a, a schematic of an A/D converter 200 according to an embodiment of the present invention is illustrated. A/D converter 200 has input multiplexer 202, input comparators 204, start-stop logic 210, delay line 216, sign detector 226, error encoder 228, slope calibration module 230, and ramp generator 232.

In preferred embodiments of the present invention, input multiplexer 202 routes one of m A/D inputs, i.e. $v_{adc\_1}$ to $v_{adc\_m}$, to the positive terminal of active comparator 206 within input comparator block 204. Ramp generator 232 generates a voltage ramp $v_{ramp}(t)$ which is reset before every cycle of clock signal clk. Active comparator 206 compares the A/D input $v_{adc}(t)$ with voltage ramp $v_{ramp}(t)$, while reference comparator 208 compares DC reference voltage $V_{ref}$ with voltage ramp $v_{ramp}(t)$. Outputs x and y of active comparator 206 and reference comparator 208 are routed to start-stop logic block 210, which controls delay line 216.

Signal start, which is preferably the OR combination of outputs x and y of comparators 206 and 208, is activated when the first of comparators 206 and 208 are triggered. Signal stop, on the other hand, which is preferably the AND combination of outputs x and y of comparators 206 and 208, is activated after both comparators 206 and 208 have been activated. In alternative embodiments of the present invention, other logic and/or circuit implementations can be used to implement start-stop logic 210. For example, signals start and stop can be latched during conversion to improve noise immunity.

Delay line 216 has a series of delay elements shown as delay elements 218, 220, 222 and 224. Only four delay elements are shown for simplicity of illustration in preferred embodiments. For an n bit A/D converter, delay line 216 preferably has a total of p elements, where $p=2^{n-1}$. Delay elements 218, 220, 222 and 224 are preferably latchable non-inverting buffers with approximately equal propagation delay times from input to output. In preferred embodiments of the present invention, when signal start goes high, a signal begins to propagate through the series of delay elements. Next, when signal stop, goes high, the output of each delay element is latched with its present state. Each delay element 218, 220, 222 and 224 has an output $d_0, d_1, d_2 \ldots d_{p-2}$ and $d_{p-1}$, respectively, which is routed to error encoder 228.

In preferred embodiments of the present invention, sign detector 226 determines whether or not output x of active comparator 206 goes high after output y of reference comparator y, which signifies that input voltage $v_{adc\_n}$ is greater than $V_{ref}$. If sign detector 226 determines that x goes high after y, then signal sign is set high. If, on the other hand, sign detector 226 determines that x goes high after y goes high, then signal sign is set low. It can be seen that the sign bit essentially represents the most significant bit of the A/D converter.

Turning to FIG. 2b, a preferred embodiment of sign detector 226 is illustrated. Sign detector 226 essentially contains two cascaded latches. The first latch is made of inverters 250 and 252 and NAND gates 254 and 256, and the second latch is made of NAND gates 258 and 260. It can be seen that if both x and y are initially low and x transitions high while y is low, the second latch is reset and output sign is, therefore, set low. If y transitions high while x is low, the second latch is set and output sign is, therefore, set high. In alternative embodiments of the present invention, sign detector 226 can be implemented using other conventional techniques known in the art.

Error encoder 228 converts outputs $d_0, d_1, d_2 \ldots d_{p-2}$ and $d_{p-1}$ from delay line 216 and signal sign from sign detector 226 to digital output word e[n]. In preferred embodiments of the present invention, the output format is two's compliment. A code of all zeros (i.e. 000000 for a 6-bit output) corresponds to the case where $v_{adc}(t)=V_{ref}$. In alternative embodiments of the present invention, error encoder 228 can be configured to output other data formats, such as sign-magnitude or floating point format can be used.

In preferred embodiments of the present invention, A/D converter 200 converts the voltage difference between $v_{adc}(t)$ and $V_{ref}$, thus making it suitable for use in a feedback network of a regulated power supply. The structure of A/D converter 200 automatically centers the quantization range around $V_{ref}$. Because a power supply feedback voltage typically has an error signal with small peak-to-peak voltage range, the preferred differential input voltage range for A/D converter 200 is small for the entire quantization range. Having fine quantization steps over a small voltage range is helpful to maintain accurate performance and maintain stability in the power supply regulation loop. As an example, for a power supply with an output voltage of about 3.3V, the total input quantization range of A/D 200 is typically about +/−330 mV for a 6-bit A/D converter. This corresponds to 32 steps of about 10 mV above and below the reference voltage. To ensure that the quantization range is adequately covered over process and temperature variations, slope calibration module 230 iteratively adjusts the slope of signal $v_{ramp}(t)$ in a calibration cycle until a predetermined desired quantization range is obtained. In alternative embodiments of the present invention, input voltage ranges and resolution of A/D converter 200 may differ from these numbers.

Figure 3B:
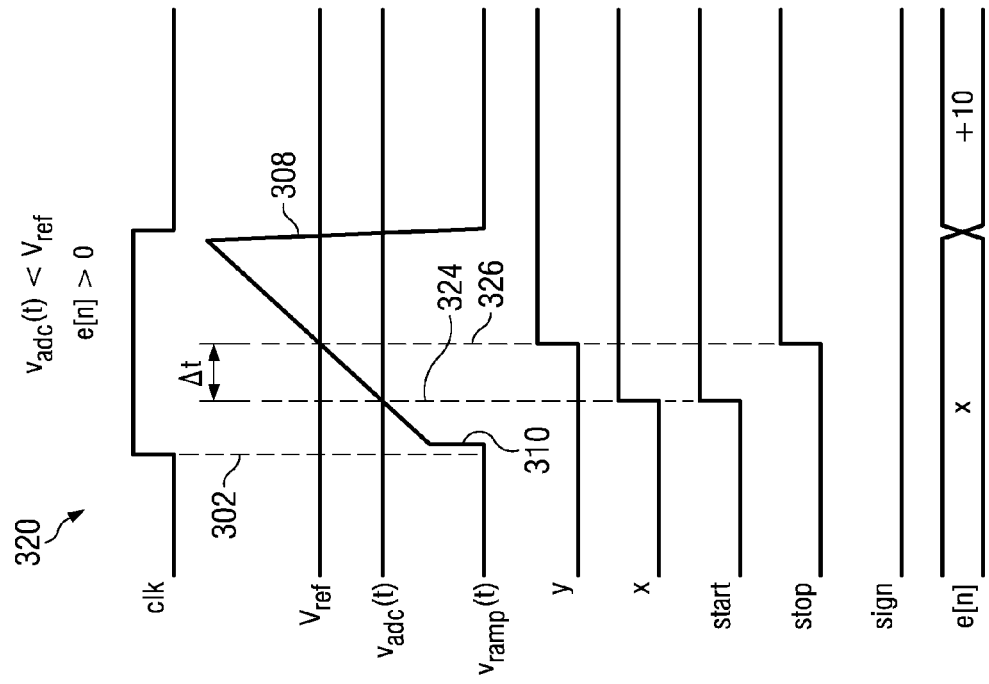
FIGS. 3a-3b illustrate waveform diagrams of the embodiment A/D converter.
Figure 3A:
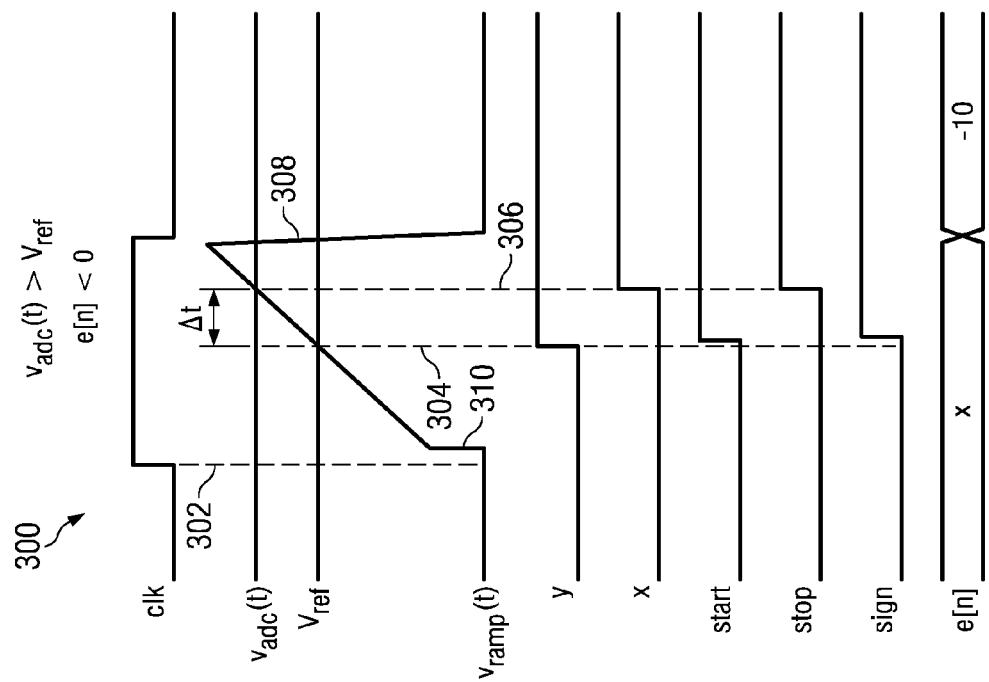

FIGS. 3a and 3b are waveform diagrams that illustrate the operation of A/D 200 (FIG. 2a). FIG. 3a illustrates the case of when $v_{adc}(t)$ is greater than $V_{ref}$. In preferred embodiments of the present invention, the voltage at $v_{ramp}(t)$ begins to increase essentially linearly after the rising edge 302 of signal clk. Because $v_{adc}(t)$ is greater than $V_{ref}$ in this example, the voltage of $v_{ramp}(t)$ becomes equal to $V_{ref}$ at a time before the voltage of $v_{ramp}(t)$ becomes equal to $v_{adc}(t)$. When $v_{ramp}(t)$ exceeds $V_{ref}$, output y of reference comparator 208 (FIG. 2a) goes high at edge 304. Because $v_{ramp}(t)$ exceeds $V_{ref}$ before $v_{ramp}(t)$ exceeds $v_{adc}(t)$, signal sign is also brought high as a result of y going high while x is still low. Furthermore, signal start goes high after edge 304, which activates delay line 216 (FIG. 2a).

When $v_{ramp}(t)$ exceeds $v_{adc}(t)$ at a time $\Delta t$ later, output x of active comparator 206 (FIG. 2a) goes high at edge 306. Consequently, signal stop goes high after edge 306, thereby deactivating delay line 216 and freezing its output state. At the falling edge of clk, error encoder 228 (FIG. 2a) encodes the state of the delay line 216 (FIG. 2a), and outputs word e[n], which in this case is the two's compliment equivalent of −10. In a preferred embodiments, an output of −10 or 10 signifies that 10 delay elements within delay line 216 (FIG. 2a) changed state within time $\Delta t$. If $|v_{adc}(t)-V_{ref}|$, were greater, for example, $\Delta t$ would comprise a longer interval, hence the absolute value of e[n] would be larger. On the other hand, if $|v_{adc}(t)-V_{ref}|$, were smaller, for example, $\Delta t$ would comprise a shorter time interval, hence the absolute value of e[n] would be smaller. In preferred embodiments of the present invention, when clk is low, $v_{ramp}(t)$ is set to a lower voltage in preparation for the next conversion cycle as seen at edge 308.

In preferred embodiments of the present invention, $v_{ramp}(t)$ has pedestal 310 when $v_{ramp}(t)$ begins to rise in voltage after clock edge 302. By initializing $v_{ramp}(t)$ with pedestal 310, the time it takes to perform an A/D conversion is reduced over embodiments that do not initialize $v_{ramp}(t)$ with pedestal 310 because the converter does not have to wait as long for $v_{ramp}(t)$ to approach the voltage range of $v_{adc}(t)$ and $V_{ref}$. In alternative embodiments of the present invention, pedestal 310 can be omitted.

FIG. 3b illustrates the case of when $v_{adc}(t)$ is less than $V_{ref}$. In this example, the voltage difference converted by the A/D converter, $v_{adc}(t)-V_{ref}$ is the same magnitude as the example of FIG. 3a, but have an opposite sign as the last example. The operation of the A/D converter in this example is similar to the example of FIG. 3b described hereinabove, except that $v_{ramp}(t)$ exceeds $v_{adc}(t)$ at edge 324 before $v_{ramp}(t)$ exceeds $V_{ref}$ at edge 326. Consequently, signal x from active comparator 206 (FIG. 2a) goes high before signal y. In this case, signal sign remains low instead of going high as in FIG. 3a. Output signal e[n], therefore is 10 in two's compliment form. In alternative embodiments of the present invention, signal polarities may be different.

Figure 4:
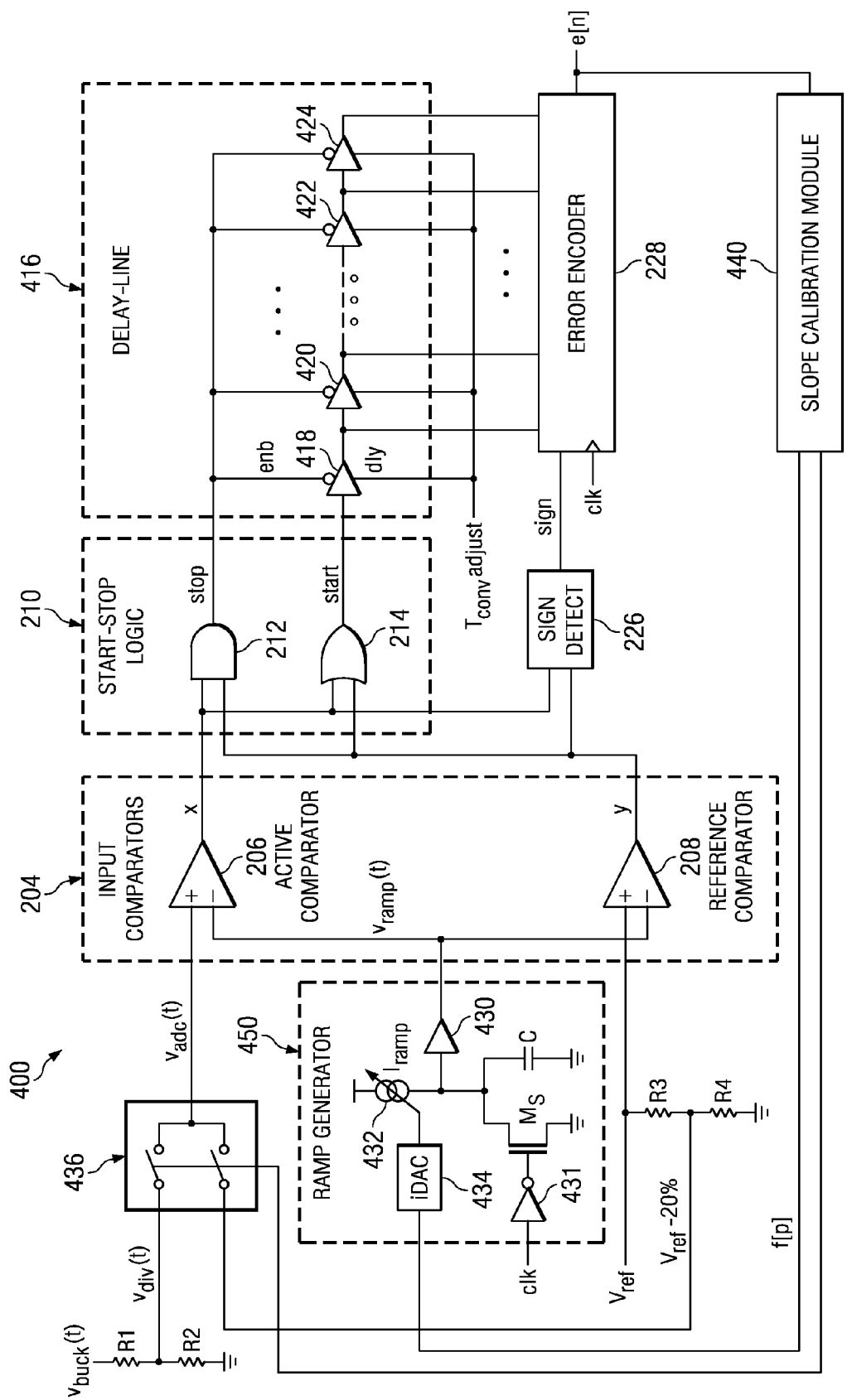
FIG. 4 illustrates a further embodiment A/D converter.

Turning to FIG. 4, an embodiment A/D converter 400 is shown with slope calibration circuitry. Input voltage $v_{buck}(t)$ represents an output voltage of a buck switching converter. In embodiments where $v_{buck}(t)$ has a high DC voltage value, $v_{buck}(t)$ is preferably divided down to a lower voltage using a resistor divider made of resistors R1 and R2. The output voltage $v_{div}(t)$ of the resistor divider is $v_{buck}(t)*R2/(R1+R2)$, which is preferably within the voltage compliance range of switch 436 and active comparator 206. In some embodiments of the present invention, a small filtering capacitor can be coupled from $v_{div}(t)$ to ground.

In a preferred embodiment, ramp generator 450 has integration capacitor C, switching transistor $M_S$, variable current source 432, and current DAC 434. Signal clk is logically inverted by inverter 431 and coupled to the gate of switching transistor $M_S$. Therefore, when signal clk is low, switching transistor $M_S$ discharges capacitor C to ground. When clk goes high, switching transistor $M_S$ turns off and current $I_{ramp}$, generated by variable current source 432, charges capacitor C producing a positive ramp voltage. The drain of switching transistor $M_S$ is coupled to buffer 430 to produce voltage $v_{ramp}(t)$. Buffer 430 is preferably implemented as a source follower using a PMOS transistor (not shown). The DC offset produced by the source follower can be used produces pedestal 310 (FIG. 3a).

Current DAC 434, controlled by slope calibration logic 440 via control word f[p], provides a reference current for variable current source 432. Current DAC 434 is preferably between 6-8 bits. Capacitor C is preferably between about 1 pF and about 5 pF, and current $I_{ramp}$ is preferably between about 5 µA and about 100 µA. In alternative embodiments of the present invention, other resolutions, capacitances and currents can be used for DAC 434, capacitor C and current $I_{ramp}$ respectively.

Switch 436, under the control of slope calibration logic 440, selects between $v_{div}(t)$ and the output of the voltage divider formed by R3 and R4, which divides $V_{ref}$ down to a voltage that represents a boundary of the desired quantization range. In a preferred embodiment, this quantization range boundary corresponds to between about $V_{ref}-10\%$ and about $V_{ref}-20\%$. (A value of $V_{ref}-20\%$ is shown in FIG. 4.) In alternative embodiments of the present invention, however, the quantization range may be different or the reference voltage may be generated in an alternative fashion, for example, by using an active circuit.

In the embodiment of FIG. 4, delay line 416 has delay elements 418, 420, 422 and 424. Only four delay elements are shown for convenience of illustration, delay line 416 preferably has a total of p elements, where $p=2^{n-1}$ for an n-bit converter. These delay elements have an adjustable delay value controlled by signal $T_{conv}$ adjust.

Slope calibration logic 440 iteratively adjusts the slope of $v_{ramp}(t)$, by controlling current DAC 434 that adjusts $I_{ramp}$, and performs conversions until a target value for e[n] is reached. The first step in the calibration process is routing the quantization boundary voltage $V_{ref}-20\%$ via switch 436 under the control of slope calibration logic 440. Next, an initial current DAC value f[p] written to DAC 434, a conversion is performed, and output e[n] is evaluated by comparing it to a target value. In preferred embodiments of the present invention, the target output value for e[n] is $2^{n-1}-2$ for an n-bit A/D converter. In a preferred embodiment using a 6-bit A/D converter the target output value for e[n] is 30, which corresponds to a value 1 LSB less than the full output range. In alternative embodiments of the present invention other target values may be used.

If value for e[n], is less than the target value, then the slope of $v_{ramp}(t)$ is increased. If, on the other hand, the value for e[n], is greater than the target value, then the slope of $v_{ramp}(t)$ is increased. The cycle of measurement and adjustment is repeated until e[n] reaches its target value.

Figure 5B:
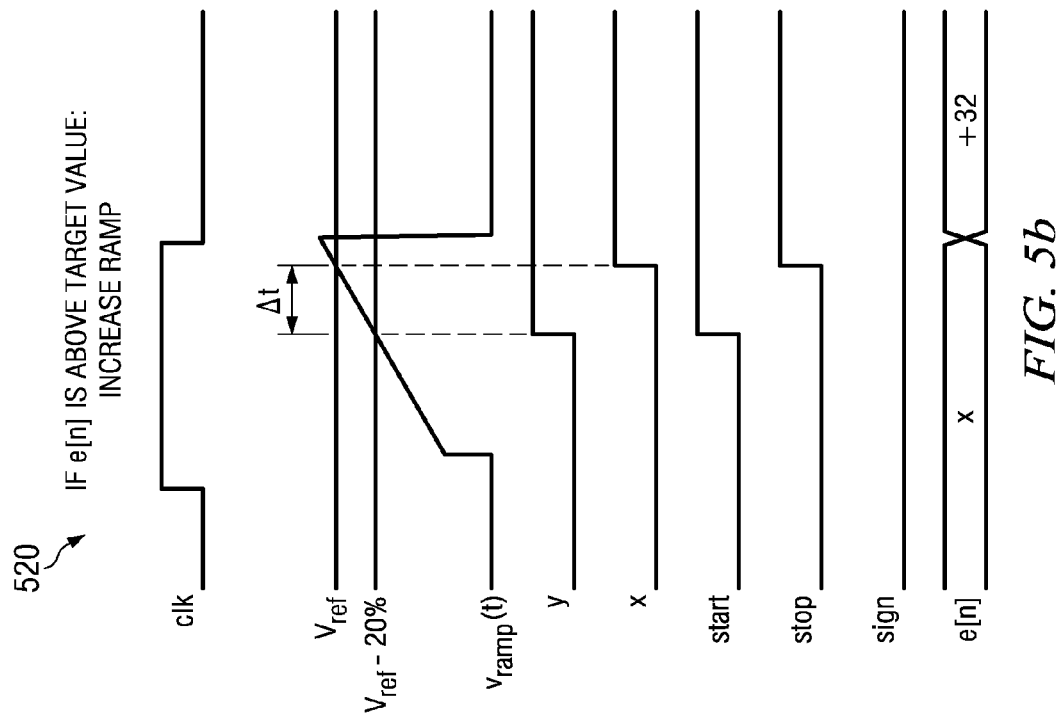
FIGS. 5a-5c illustrate waveform diagrams of the further embodiment A/D converter during a calibration cycle.
Figure 5A:
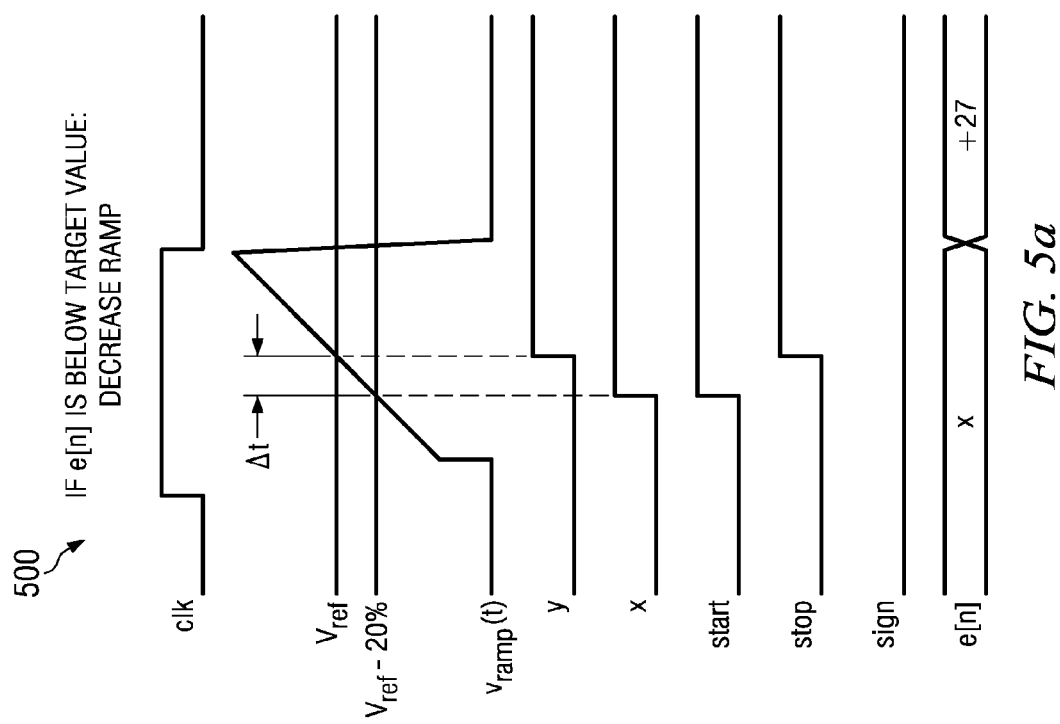
Figure 5C:
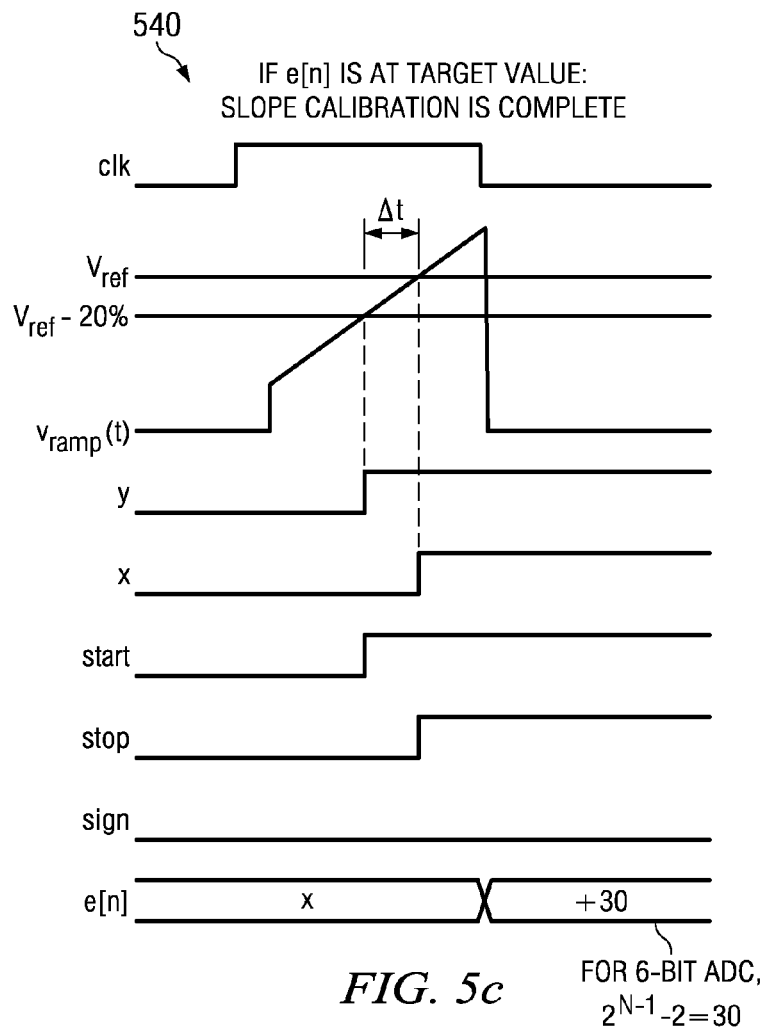

FIGS. 5a-5c show waveform diagrams illustrating an embodiment range calibration cycles assuming a 6-bit A/D converter and a target value of 30 for e[n]. FIG. 5a illustrates the case where the slope of $v_{ramp}(t)$ is too high and e[n] produces value of 27. When e[n] is less than the target value, slope calibration logic 440 (FIG. 4) decreases the slope of $v_{ramp}(t)$ by outputting a new value for f[p] that decreases $I_{ramp}$ via current DAC 434. Another A/D conversion is then performed. For example, FIG. 5b illustrates a case where the slope of $v_{ramp}(t)$ is less than the slope of $v_{ramp}(t)$ in FIG. 5a. Here, however, e[n] attains a value of 32, which is greater than the target value of 30, thereby signifying that the slope of $v_{ramp}(t)$ is too low. When e[n] is too high, slope calibration logic 440 (FIG. 4) increases the slope of $v_{ramp}(t)$ by outputting a new value for f[p] that decreases $I_{ramp}$ via current DAC 434 and then performs another A/D conversion.

The waveform diagram of FIG. 5c, which is typical of a last calibration measurement cycle in embodiments of the present invention, illustrates a case where the slope of $v_{ramp}(t)$ is within a range that yields the target value of 30 for e[n]. Here, the previous value of f[p] written to current DAC 434 (FIG. 4) is maintained for subsequent conversions. Once the target value has been obtained, slope calibration logic 440 exits the calibration mode by reconnecting $v_{div}(t)$ to $v_{adc}(t)$ via switch 436.

In preferred embodiments of the present invention, whether or not the A/D converter is in calibration is verified during operation by coupling the output of the R3-R4 voltage divider (FIG. 4), $V_{ref}-20\%$, via switch 436 (FIG. 4) and performing an conversion cycle. Verifying the calibration of the A/D converter in this manner can also be used within the system as a built-in self test. For example, if a calibration cycle is not performed correctly, the resulting value of f[p] and/or e/n] would saturate.

In an embodiment of the present invention, slope calibration logic 440 uses a successive approximation technique to settle on the correct value for f[p] during the calibration cycle. For example, the initial value for f[p] can be at ½ scale. If the slope is too small, then the next value for f[p] is ¾ scale; if the slope is too large, then the next value for f[p] is ¼ scale. If, for example, f[p] is ¼ still yields too large of a slope, the next value for f[p] would be ⅛ scale. This algorithm continues bit by bit until the full resolution of is reached. The successive approximation technique is preferable for obtaining an initial calibration value if the A/D has not been previously calibrated.

In another embodiment of the present invention, an incremental technique can be used. For example, if a particular value of yields a slope of $v_{ramp}(t)$ that is too low, then f[p] is incremented by one LSB. In embodiments of the present invention that use the incremental technique, f[p] can initialized with a previous calibration value. By initializing f[p] with a previous calibration value, calibration can be obtained and/or verified in a small number of cycles if there has been little drift. In other embodiments, the successive approximation technique can be used for the initial calibration cycle, and the incremental technique can be used in all subsequent cycles. In alternative embodiments of the present invention, other linear or non-linear calibration schemes can be used.

FIGS. 6a-6d are schematics that illustrate embodiment delay elements with adjustable delay times. These delay elements can be used for delay elements 418, 420, 422 and 424 shown in FIG. 4. In some embodiments of the present invention, each of these delay elements have substantially the same delay time. In other embodiments of the present invention, however, different delay times can be used in order to create a non-linearity in the transfer characteristic of the A/D converter. This non-linearity can then be used to improve the closed-loop dynamic response when the ADC is used in switch-mode power supply applications. Furthermore, in some embodiments, the delay of the first element can be selected to be different from the other delays in order to customize the size of the "zero-error bin," which corresponds to the case where $v_{adc}(t)$ is approximately equal to $V_{ref}$. By customizing the size of the "zero error bin" (i.e., by making the "zero error bin" wider), undesirable effects such as subharmonic limit cycle oscillations can be reduced or eliminated.

Figure 6A:
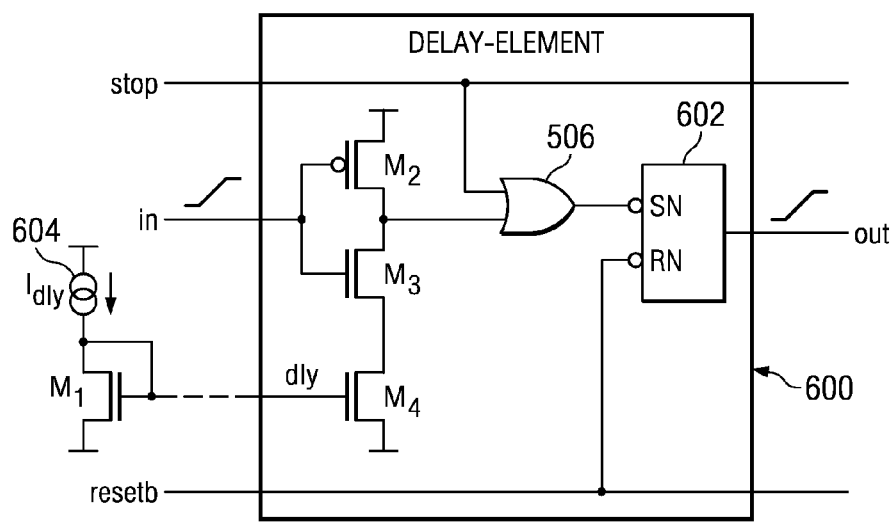
FIGS. 6a-6d illustrate schematics of embodiment delay elements.

In FIG. 6a, delay element 600 has an inverter made of PMOS transistor $M_2$ and NMOS transistor $M_3$ coupled in series with NMOS current source transistor $M_4$. Alternatively, current source transistor $M_4$ can be implemented with a PMOS transistor coupled in series with the source of PMOS transistor $M_2$. The gate of transistor $M_4$ at node dly is controlled by diode-connected current mirror transistor $M_1$, which is driven by current $I_{dly}$. Essentially the combination of transistors M2, M3 and M4 form a current starved inverter whose delay is controlled by $I_{dly}$. This delay is inversely proportional to $I_{dly}$. Input in of delay element 600 is coupled to the input of the current starved inverter. The output of the current starved inverter is coupled to SR latch 602 via OR gate 606. SR latch 602 has active low inputs and OR gate 606 has signal stop and the output of the current starved inverter as inputs. In preferred embodiments of the present invention, one SR latch is used for each delay cell. Alternatively, other structures can be used for the latch instead of an SR latch, such as other conventional latch structures. In converters having high resolution requirements, for example greater than eight bits, silicon area can be conserved if a dynamic latch is used. For example, the parasitic capacitance of an internal node within the delay element can be used to store the state of the delay element.

If signal stop is low when input signal in goes high, input SN of SR latch 602 is pulled low, thereby setting SR latch 602 and driving signal out high. When signal stop is high, however, the output of OR gate 606 remains high, and SR latch 602 is prevented from being set. If SR latch 602 was set prior to signal stop going high, then SR latch 602 maintains its state. Signal resetb is an active low signal provided to reset SR latch 602 before each A/D conversion. During a conversion, latches in each of the delay elements are successively set during a conversion as the pulse travels through the delay line.

Figure 6B:
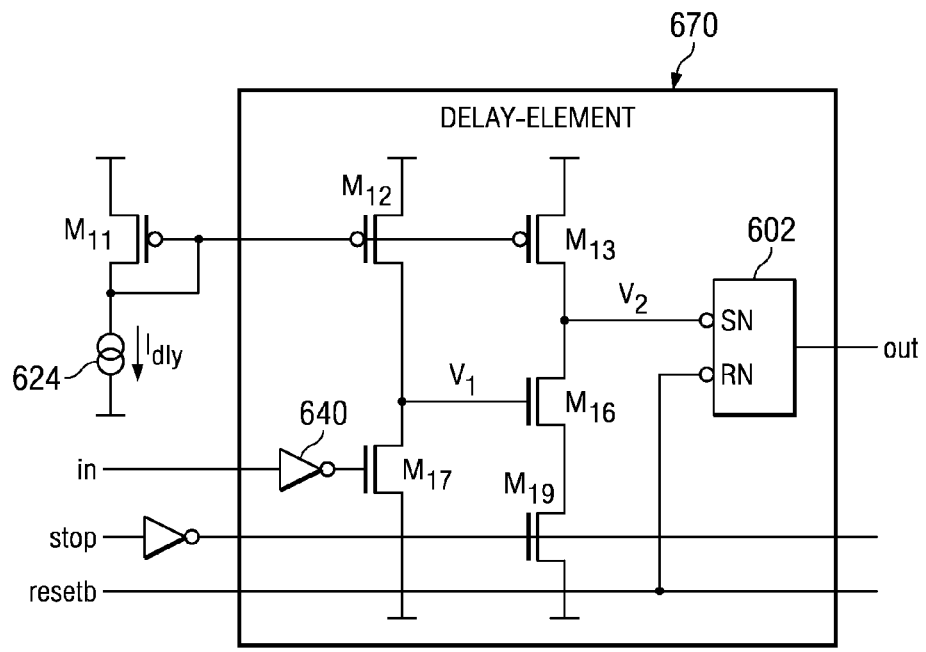

FIG. 6b illustrates another embodiment delay element 620 having improved power supply rejection over the embodiment shown in FIG. 6a. PMOS transistors $M_{10}$, $M_{12}$ and $M_{13}$ act as current mirror transistors and are, therefore, preferably implemented using long channel devices. Current mirror transistors $M_{12}$ and $M_{13}$ form active loads for input transistors $M_{17}$, and $M_{16}$ respectively. Transistor $M_{19}$ inhibits SR latch 602 from being set when signal stop is high.

During operation, when input signal in goes high, the output of inverter 640 goes low, thereby shutting off NMOS transistor $M_{17}$ by driving its gate low. The voltage at node v1 goes high at a rate determined by current Idly mirrored to transistor $M_{12}$. The rise time at the gate of $M_{16}$ is essentially independent of the supply voltage. As node v1 rises, NMOS transistor $M_{16}$ turns on if NMOS transistor is also on (when stop is low). Because the second current-starved inverter comprising of $M_{13}$, $M_{16}$ and $M_{19}$ is ground referenced, second current-starved inverter has a logic threshold which is also independent of the supply voltage. Latch 602 becomes set as node v2 discharges toward ground.

Figure 6C:
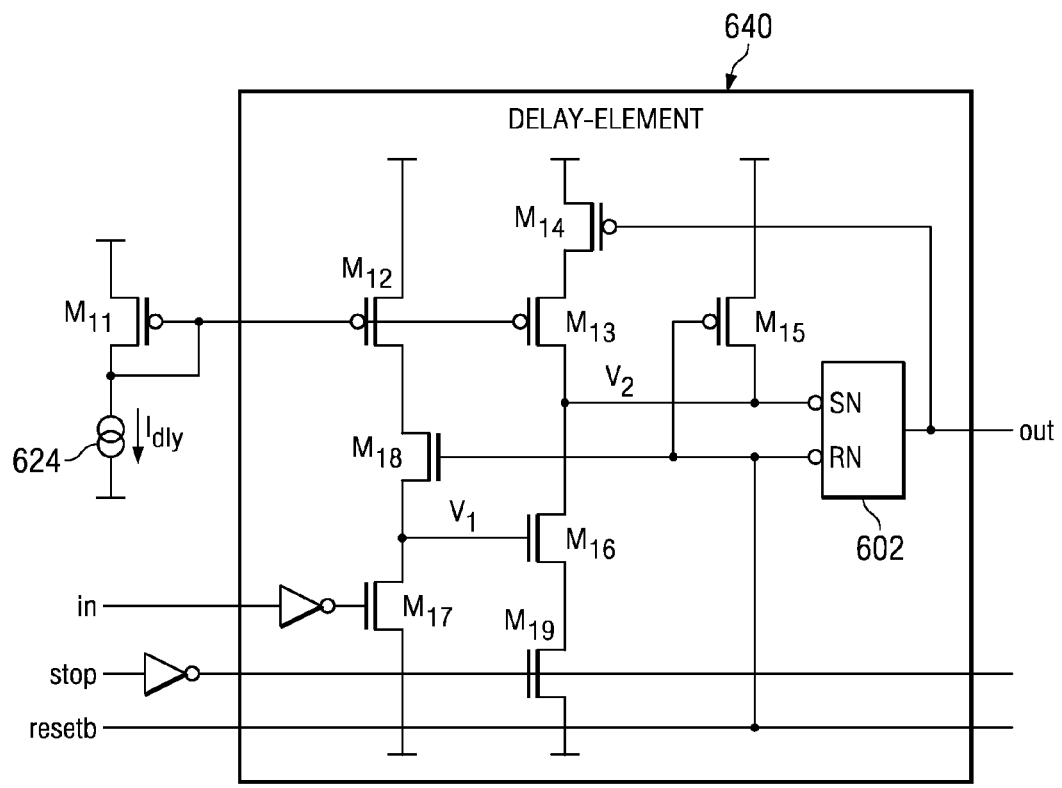

FIG. 6c illustrates delay element 640, which is a modified embodiment of delay element 620 of FIG. 6b. Delay element 640 further includes transistors $M_{14}$, $M_{15}$ and $M_{18}$, which prevents quiescent DC current from flowing through both current starved inverters during operation. For example, in the circuit of FIG. 6b, when $M_{17}$ is on, a DC current flows though $M_{12}$ and $M_{17}$. In the circuit of FIG. 6c, however, NMOS transistor $M_{18}$ prevents current flowing though $M_{12}$ and $M_{17}$ when resetb is low. PMOS transistor $M_{14}$ with its gate coupled to the output of SR latch 602, on the other hand, prevents DC current flowing though M13, M16 and $M_{19}$ when the gate of $M_{16}$ is high (which occurs after RS latch 602 is set). PMOS transistor $M_{15}$ presets node v2 to the supply voltage when resetb is low prior to a conversion. Presetting node v2 to the supply voltage prevents RS latch 602 from being set prematurely at the beginning of a conversion cycle.

By preventing DC current conduction, the addition of transistors $M_{14}$, $M_{15}$ and $M_{18}$ to delay element 640 allows the A/D converter to be used in very low-power applications such as mobile phones and other portable battery powered devices.

Figure 6D:
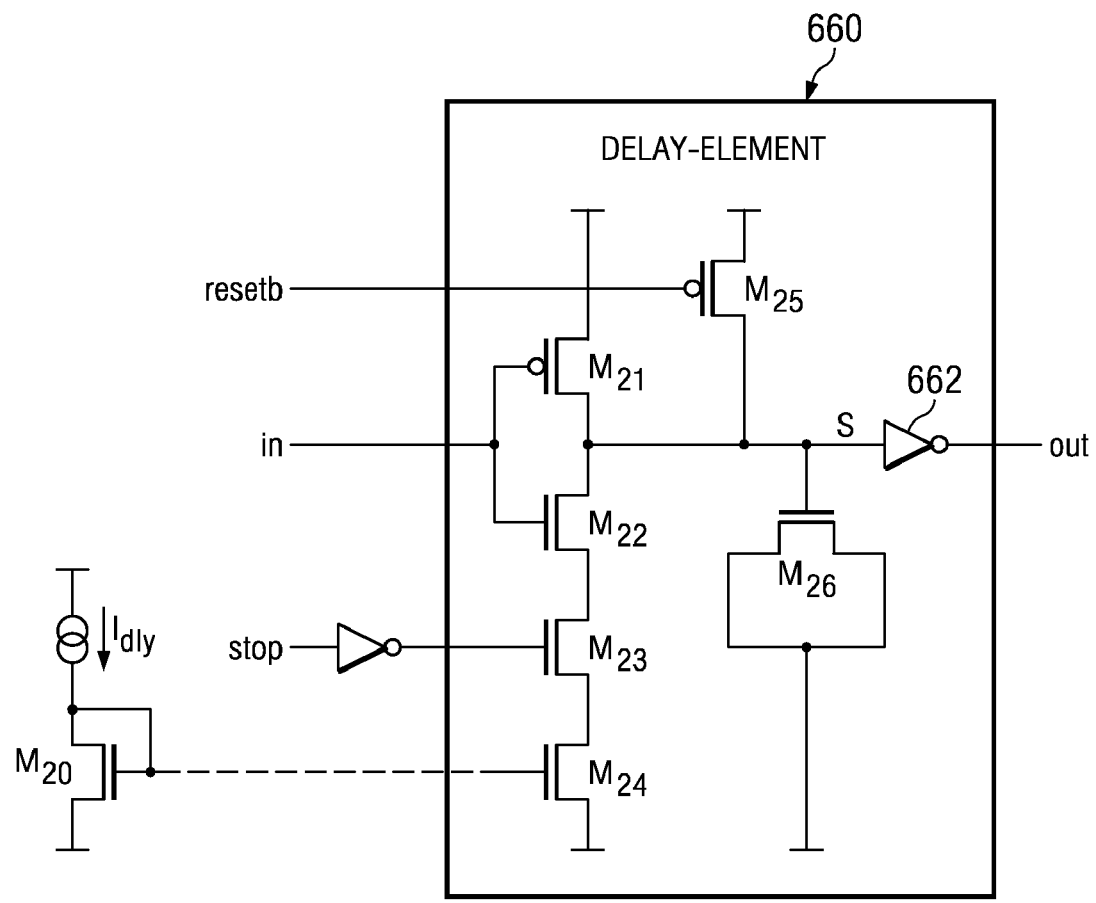

FIG. 6d illustrates an embodiment delay element 660 using dynamic logic. Delay element 660 has a current starved inverter made of PMOS transistor $M_{21}$ and NMOS transistors $M_{22}$, $M_{23}$ and $M_{24}$ loaded by transistor $M_{26}$ used a capacitor. In alternative embodiments of the present invention other capacitor structures can be used besides an MOS transistor, for example, a MOS gate oxide capacitor or a metal capacitor. When resetb is set low prior to a conversion, node s is precharged to VDD via PMOS transistor $M_{25}$. When node in goes high, the capacitance at the gate of $M_{26}$ is discharged though the inverter. The speed at which the gate of $M_{26}$ is discharged is determined by current $I_{dly}$, which is mirrored to $M_{24}$ via $M_{20}$. When stop is goes high, transistor $M_{23}$ is shut off, which prevents node s from being discharged. Node s is buffered to node out via inverter 662. It can be seen that delay element 660 functions both as a programmable delay element and as a dynamic latch which stores the state of the delay element after signal stop is asserted. In alternative embodiments of the present invention, other dynamic delay element architectures can be used. For example, architectures that possess higher power supply rejection ratios (PSRR).

Figure 7A:
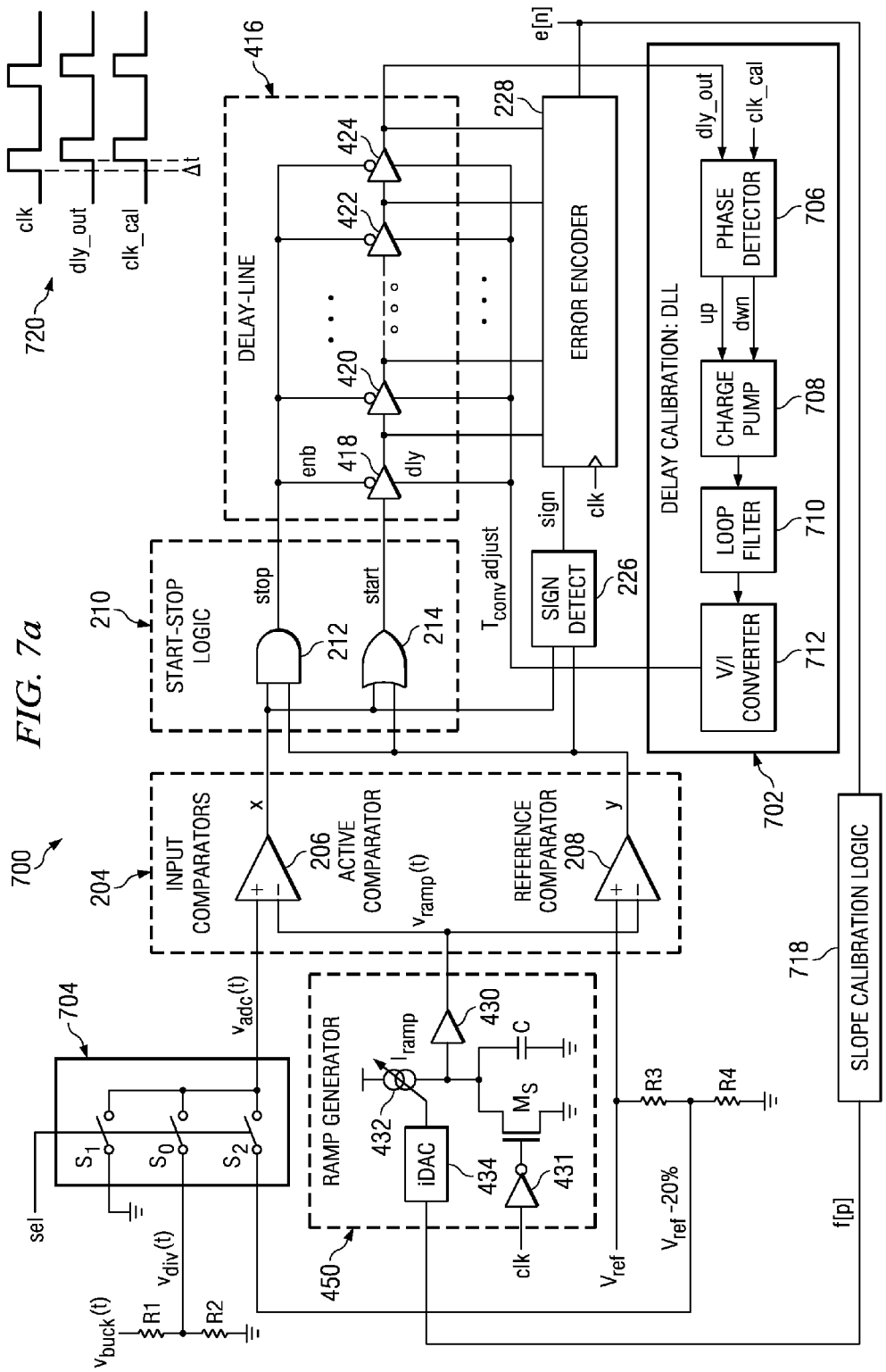
FIGS. 7a-7b illustrate embodiment A/D converters using delay locked loops (DLL) to calibrate the delay line.
Figure 7B:
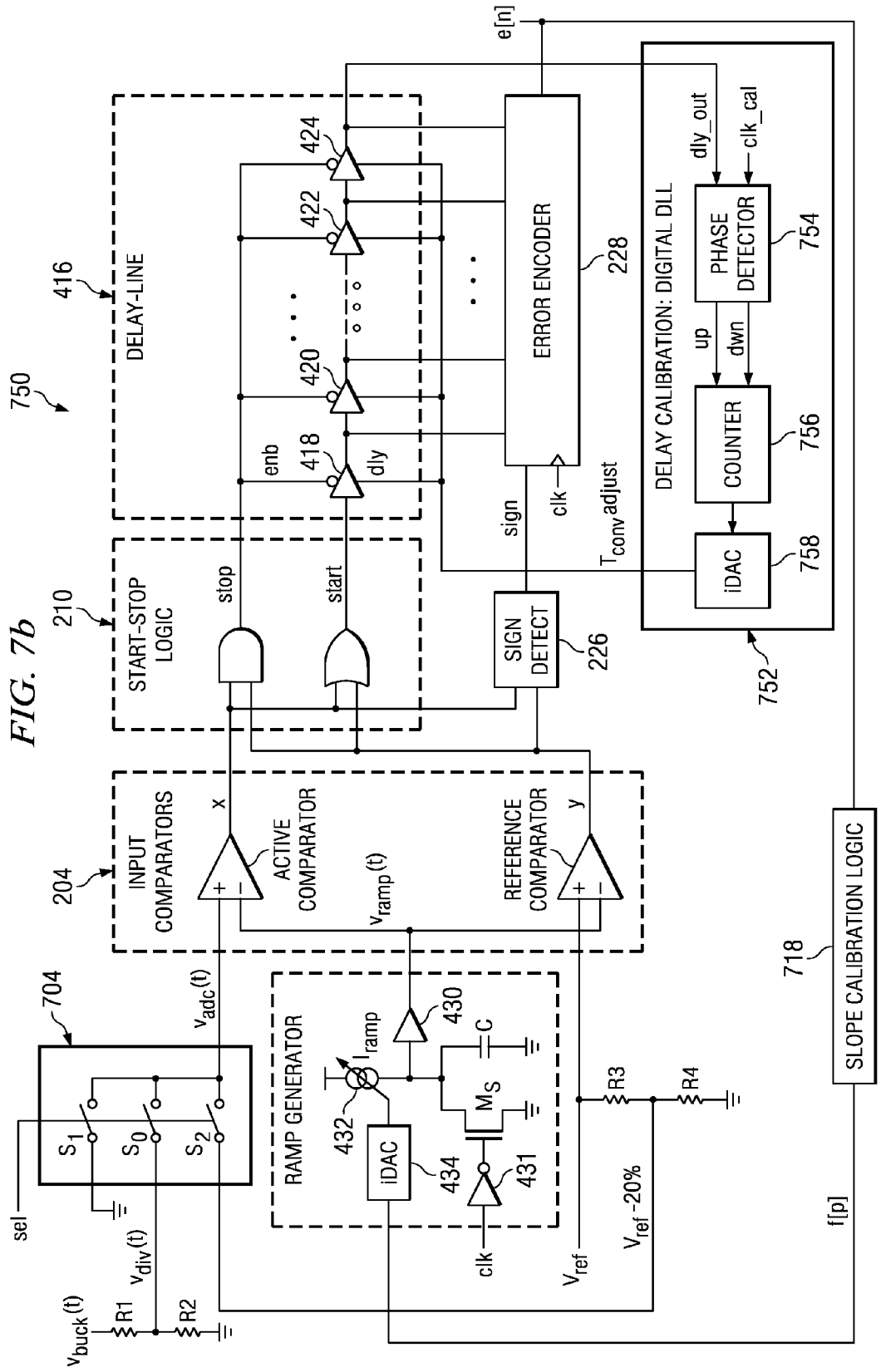

FIGS. 7a-7b illustrate embodiments of the present invention that provide for calibration of the delay line.

Turning to FIG. 7a, an embodiment A/D converter 700 is shown using delay locked loop (DLL) 702 to calibrate the total delay of delay line 416. Delay calibration is first initiated by closing $S_1$, which sets the A/D 700 input $v_{adc}(t)$ to 0V. Setting $v_{adc}(t)$ to ground ensures a maximum delay between the rising edges of start and stop, thereby allowing a pulse to propagate through entire delay line 416 when a conversion is initiated by signal clk. The output of the last delay cell in delay line 416 will rise after a delay of $\Delta t_{dl}$ following the rising edge of clk. Delay locked loop (DLL) 702 is used to lock the delay $\Delta t_{dl}$ to a reference delay $\Delta t$. The reference delay is provided by the calibration clock clk_cal. Signal clk_cal is delayed from $\Delta t$ by an integer number cycles of the oscillator clock inside the digital core. In preferred embodiments DLL 702, adjusts the current in delay cells 418, 420, 422 and 424. DLL 702 has phase detector 706, charge-pump 708, loop filter 710, and voltage to current (V/I) converter 712. As shown in timing diagram 720, DLL 702 is configured to synchronize the rising edges of the clk_cal and the dly_out. In preferred embodiments of the present invention, DLL 702 is implemented using a an analog circuit using conventional circuit design techniques.

Turning to FIG. 7b, an embodiment of the present invention is shown using digital DLL 752 to calibrate the total delay of delay line 416. Digital DLL 752 has phase detector 754, counter 756 and current mode D/A converter (iDAC) 758. In modern sub-micron CMOS processes, it may be more cost-effective to implement the digital DLL using digital logic. In digital DLL 752, the loop filter 710 (FIG. 7a) is replaced by a counter and V/I converter 712 (FIG. 7a) is replaced by iDAC 758. A digital implementation may also consume less power and require less silicon area than an equivalent analog implementation.

In embodiments of the present invention targeted toward low-frequency applications, such as stand-alone DC-DC converters operating at a switching frequency below 500 kHz, it may be unnecessary to actively calibrate the delay of the delay-cells, since the slope calibration process described hereinabove above can automatically compensate for small delay variation, such as delay variations due to fluctuations in process, temperature, and supply voltage. In embodiments targeted toward applications where the conversion time is critical, delay calibration can be used to guarantee a maximum conversion time.

Figure 8:
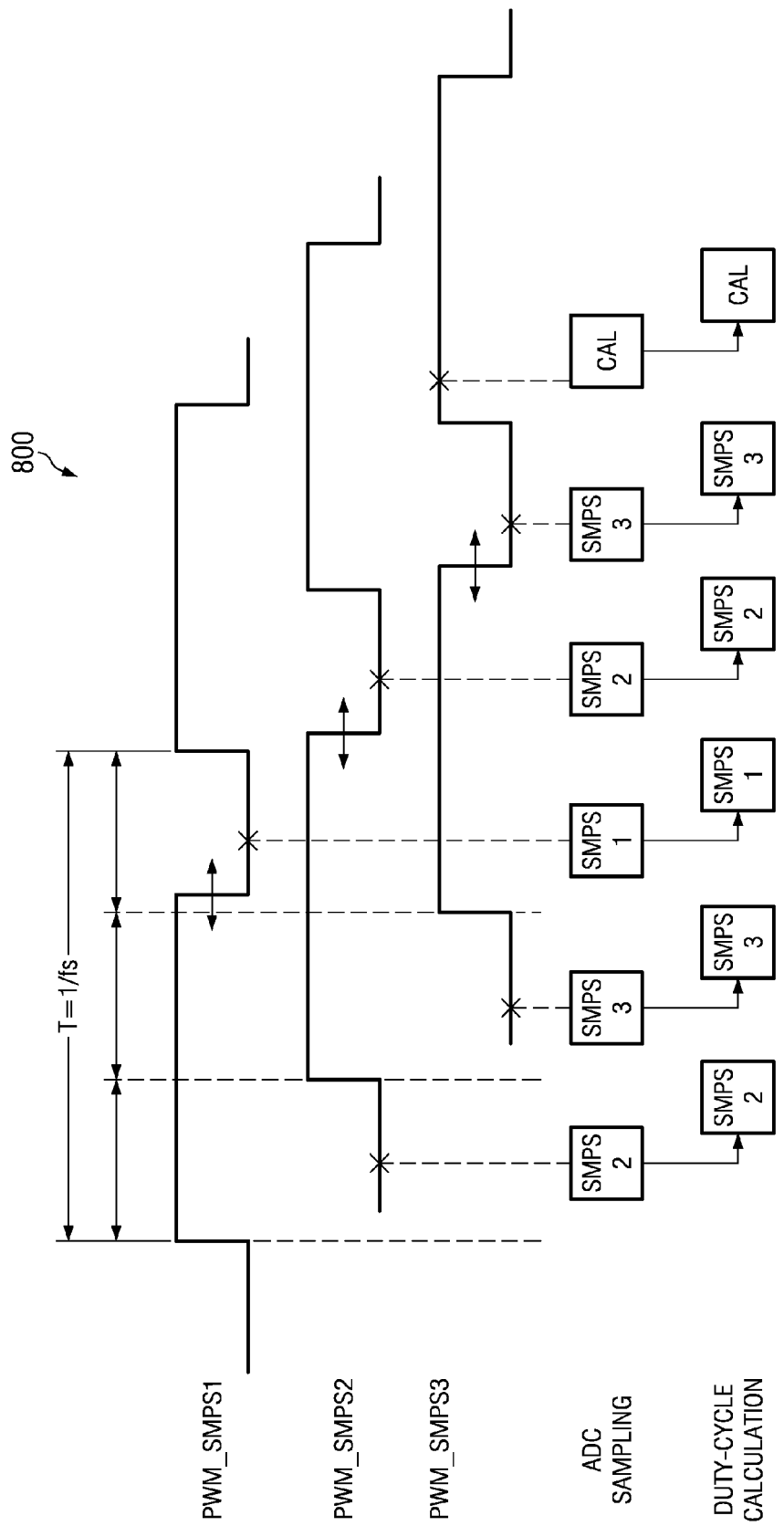
FIG. 8 illustrates an embodiment conversion and calibration cycle schedule for an embodiment power supply system.

FIG. 8 illustrates an embodiment conversion and calibration cycle schedule for an embodiment A/D converter having three multiplexed inputs. Signals PWM_SMPS1, PWM_SMPS2 and PWM_SMPS3 represent the pulse width modulator outputs driving three independently regulated switched mode power supplies SMPS 1, SMPS 2 and SMPS 3, respectively. Each of these switched mode power supplies can be of different types (i.e, a combination of boost, buck-boost, buck, etc.) The boxes on the ADC sampling axis signify the conversion times for each of the three power supplies. In preferred embodiments of the present invention, the time allotted for each conversion cycle is about 5 to 25% of the switching period_T=1/fs, where fs is the switching frequency.

It can be seen that each power supply output is converted prior to the rising edge of its respective PWM signal to prevent ripple and transient voltages on the output of each power supply from affecting the accuracy of the voltage measurement. After each conversion, a new duty cycle for each power supply is calculated as shown by the boxes on the duty cycle calculation axis. In the illustrated embodiment, a calibration of the A/D converter is performed once every six ADC sampling cycles. In preferred embodiments, the calibration cycle is used alternatively for slope and delay calibrations, with a typical ratio of 8 delay calibrations for each slope calibration. Due to the nature of the delay calibration DLL, the delay control signal is preferably refreshed more frequently than the slope calibration signal because of leakage and change injection. In embodiments of the present invention, it is preferable to choose the power supply with the lowest regulation bandwidth to substitute calibration cycles for measurement cycles. In alternative embodiments of the present invention, a larger or smaller number of power supply systems can be scheduled to use the same A/D, and other calibration schedules can be used depending on the requirements of a particular application.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted.

What is claimed is:

1. An analog to digital (A/D) converter comprising:
    a ramp signal generator comprising a ramp signal output and a clock trigger input;
    a delay line comprising a plurality of delay elements;
    a delay line controller configured to
        activate the delay line and initiate a signal propagating through the delay line when the ramp signal output first crosses a first of an A/D converter input signal at an A/D input or a reference signal at a reference signal input, and
        deactivate the delay line and sample a state output of the delay line when the ramp signal crosses a second of the A/D converter input signal or the reference signal; and
    a slope calibration module coupled to the ramp generator, the calibration module configured to adjust a slope of the ramp signal output.

2. The A/D converter of claim 1, wherein the delay line comprises an adjustable delay time.

3. The A/D converter of claim 2, further comprising a delay calibration module, the delay calibration module configured to adjust the adjustable delay time to about a predetermined delay time.

4. The A/D converter of claim 3, wherein the delay calibration module comprises an analog delay locked loop.

5. The A/D converter of claim 3, wherein the delay calibration module comprises a digital delay locked loop.

6. The A/D converter of claim 1, wherein the ramp signal comprises a ramp voltage, and the reference signal comprises a fixed voltage.

7. The A/D converter of claim 1, further comprising an input multiplexer configured to couple a plurality of inputs to the A/D converter input.

8. The A/D converter of claim 1, wherein:
    at least one of the plurality of delay elements comprise a dynamic latch; and
    the dynamic latch is comprised of a parasitic capacitance within the delay element, the parasitic capacitance storing a state of the delay element.

9. The A/D converter of claim 1, wherein a first of the plurality of delay elements disposed at a beginning of the delay line comprises a longer delay than other ones of the plurality of delay elements.

10. The A/D converter of claim 1, wherein at least some of the plurality of delay elements comprise non-uniform delay times configured to provide the A/D converter with a non-uniform transfer characteristic.

11. An analog to digital (A/D) converter comprising:
a ramp signal generator comprising a ramp signal output and a clock trigger input;
an active comparator comprising a first input coupled to the ramp signal output and a second input coupled to an A/D input;
a reference comparator comprising a first input coupled to the ramp signal output and a second input coupled to a reference signal;
control logic coupled to an output of the reference comparator and an output of the active comparator, wherein
the control logic is configured to assert a start signal if the output of the reference comparator or the output of the active comparator is active, and
the control logic is further configured to assert a stop signal if both the output of the reference comparator and the output of the active comparator is active; and
a delay line comprising a plurality of delay elements, the delay line coupled to a start signal and a stop signal, wherein the delay line is configured to
activate the delay line and initiate a signal propagating through the delay line when the start signal becomes active and the stop signal is inactive, and
deactivate the delay line and produce a state output of the delay line when the stop signal becomes active.

12. The A/D converter of claim 11, further comprising an output encoder coupled to the state output of the delay line, the output encoder configured to produce an encoded delay line state at an output of the output encoder.

13. The A/D converter of claim 12, further comprising a sign detector comprising a first input coupled to the output of the active comparator and a second input coupled to the output of the reference comparator, the sign detector configured to produce a first output state at an output if the reference comparator triggers before the active comparator and a second output state at the output if the reference comparator triggers after the active comparator.

14. The A/D converter of claim 13, wherein:
the output encoder is coupled to the output of the sign detector; and
the encoded delay line state comprises sign information based on the output of the sign detector.

15. The A/D converter of claim 14, wherein the output encoder is configured to output the delay line state and sign information in a binary two's compliment format.

16. The A/D converter of claim 11, wherein
the ramp signal generator further comprises a slope calibration module coupled to the ramp signal generator, the calibration module configured to adjust a slope of the ramp signal output; and
the slope calibration module is further configured to couple a fixed signal to the second input of the active comparator and iteratively adjust the slope of the ramp signal output until the A/D converter outputs a predetermined output value corresponding to the fixed signal.

17. The A/D converter of claim 16, wherein the fixed signal comprises a signal comprising a value of about 20% of the reference signal, and the predetermined output value comprises a value one significant digit away from a maximum or minimum output value.

18. The A/D converter of claim 11, wherein at least one of the plurality of delay elements comprises:
a latch comprising an output;
a current starved inverter coupled to a delay element input, the current starved inverter comprising an adjustable current source and an output configured to change the state of the latch when the output is asserted; and
a stop input configured to inhibit the state of the latch from being changed.

19. The A/D converter of claim 11, wherein at least one of the plurality of delay elements comprises:
a first switch comprising a control terminal coupled to a delay element input, and an output terminal loaded by a first current source;
a second switch coupled comprising a control terminal coupled to the output terminal of the first switch, and an output terminal loaded by a second current source;
a latch comprising an input coupled to the output terminal of the second switch, and an output coupled to a delay element output; and
a third switch coupled in series with the second switch, the third switch comprising a control terminal coupled to a stop signal input.

20. The A/D converter of claim 19, wherein the latch comprises a reset input coupled to a delay element reset input.

21. The A/D converter of claim 20, wherein the at least one of the plurality of delay elements comprises:
a fourth switch coupled in series with the second current source, the fourth switch comprising a control terminal coupled to the latch output, wherein the fourth switch is configured to disable the second current source when the latch output is asserted;
a fifth switch comprising a control terminal coupled to the reset input of the latch and an output terminal coupled to the set input of the latch, the fifth switch configured to prevent the latch form setting when the reset input is being asserted; and
a sixth switch in series with the first switch comprising a control input coupled to the reset input of the latch, the sixth switch configured to prevent a signal asserted at the delay input from propagating through the delay element.

22. The A/D converter of claim 21, wherein:
the first, second, third, and sixth switches comprise NMOS transistors; and
the fourth and fifth switches comprise PMOS transistors.

23. A method of performing an analog to digital (A/D) conversion comprising:
comparing a reference signal to a ramp signal;
comparing an input signal to the ramp signal;
causing a signal to propagate through a delay line when the ramp signal crosses a first of the reference signal or the input signal; and
storing a state of the delay line when the ramp signal crosses a second of the reference signal or the input signal after the ramp signal crosses the first of the reference or the input signal.

24. The method of claim 23, further comprising converting the state of the delay line to an output code after storing the state of the delay line.

25. The method of claim 23, further comprising determining whether the ramp signal crosses the reference signal before the ramp signal crosses the input signal.

26. The method of claim 25, further comprising:
after storing the state of the delay line and after determining whether the ramp signal crosses the reference signal before the ramp signal crosses the input signal, converting the state of the delay line to an output code, wherein the output code is based on
the state of the delay line, and
the determining whether the ramp signal crosses the reference signal before the ramp signal crosses the input signal.

27. The method of claim 26, wherein converting comprises producing a binary sign-magnitude output code.

28. The method of claim 23, further comprising calibrating an input range of the A/D converter, the calibrating comprising adjusting the slope of the ramp signal, wherein adjusting comprises determining a next slope of the ramp signal.

29. The method of claim 28, wherein determining the next slope comprises applying a successive approximation algorithm.

30. The method of claim 28, wherein determining the next slope comprises adjusting a digital to analog converter (DAC) 1 LSB at a time, wherein the DAC is configured to control the slope of the ramp signal.

31. The method of claim 28, wherein calibrating comprises:
coupling a test signal to the input signal;
iteratively performing A/D conversions and adjusting the slope until a predetermined state of the delay line is obtained.

32. The method of claim 23, further comprising calibrating an input range of the A/D converter, the calibrating comprising adjusting a delay time of the delay time using a delay locked loop.

33. The method of claim 23, further comprising:
determining whether the ramp signal crosses the reference signal before the ramp signal crosses the input signal;
after determining and storing, converting the state of the delay line to an output code, wherein the output code is based on the state of the delay line and the determining whether the ramp signal crosses the reference signal before the ramp signal crosses the input signal; and
calibrating an input range of the A/D converter, the calibrating comprising
coupling a test signal to the input signal,
iteratively performing A/D conversions and adjusting a slope of the ramp signal until a predetermined output code is obtained, and
adjusting a delay time of the delay time using a delay locked loop.

34. The method of claim 33, wherein calibrating is performed after a number of conversion cycles.

35. The method of claim 23, wherein the ramp signal comprises an initial pedestal at a start of the ramp.

36. A power supply system comprising:
a power converter comprising a power input, an output, and a control terminal, the control terminal controlling the output; and
a feedback network coupled between the output and the control terminal, the feedback network comprising an analog to digital (A/D) converter configured to convert a difference between a reference voltage and a voltage proportional to a voltage at the output of the power converter, the A/D converter comprising
a ramp signal generator comprising a ramp signal output and a clock trigger input,
an active comparator comprising a first input coupled to the ramp signal output and a second input coupled to an A/D converter input,
a reference comparator comprising a first input coupled to the ramp signal output and a second input coupled to a reference signal,
control logic coupled to an output of the reference comparator and an output of the active comparator, wherein
the control logic is configured to assert a start signal if the output of the reference comparator or the output of the active comparator is active, and
the control logic is further configured to assert a stop signal if the output of the reference comparator and the output of the active comparator is active, and
a delay line comprising a plurality of delay elements coupled to the start signal and stop signal, wherein the delay line is configured to
activate the delay line and initiate a signal propagating through the delay line when the start signal becomes active and the stop signal is inactive, and
deactivate the delay line and produce a state output of the delay line when the stop signal becomes active.

37. The power supply system of claim 36, wherein the A/D converter further comprises: a sign detector comprising a first input coupled to the output of the active comparator and a second input coupled to the output of the reference comparator, the sign detector configured to produce a first output state at an output if the reference comparator triggers before the active comparator and a second output state at the output if the reference comparator triggers after the active comparator; and
an output encoder comprising a first input coupled to the state of the delay line and a second input coupled to an output of the sign detector, the output encoder configured to converter the output of the sign detector and the state of the delay line to an encoded output word, wherein the encoded output word comprises sign information.

38. The power supply system of claim 36, further comprising a compensation circuit in series with the A/D converter.

39. The power supply system of claim 36, wherein the power converter comprises a switched mode power converter.

* * * * *